United States Patent [19]

Yasuoka

[11] Patent Number: 4,489,404
[45] Date of Patent: Dec. 18, 1984

[54] MEMORY DEVICE

[75] Inventor: Nobuyuki Yasuoka, Tokyo, Japan

[73] Assignee: NEC Corporation, Tokyo, Japan

[21] Appl. No.: 506,080

[22] Filed: Jun. 20, 1983

[30] Foreign Application Priority Data

Jun. 18, 1982 [JP] Japan .................................. 57-105757

[51] Int. Cl.³ .............................................. G11C 7/00
[52] U.S. Cl. .................................... 365/230; 365/190; 365/218
[58] Field of Search ............... 365/190, 189, 218, 230, 365/95

[56] References Cited

U.S. PATENT DOCUMENTS 4,209,851 6/1980 Ponder ................................. 365/190
4,300,213 11/1981 Tanimura et al. .................. 365/190

Primary Examiner—James W. Moffitt
Attorney, Agent, or Firm—Sughrue, Mion, Zinn, Macpeak and Seas

[57] ABSTRACT

A memory device provided with initializing function for forcibly setting contents of all the memory cells at the same predetermined logic state is disclosed. The memory device comprises a plurality of word lines, a plurality of digit lines, a plurality of memory cells arranged at the intersections of the word lines and the digit lines, and a word decoder having a plurality of output terminals coupled to the word lines, wherein the word decoder is forcibly set to take at its output terminals a selection level in response to a control signal, and at the same time the digit lines are set at the predetermined logic state in response to the control signal.

10 Claims, 8 Drawing Figures

MEMORY DEVICE

The present invention relates to a memory device, and particularly to a static type memory device fabricated on a semiconductor chip.

The static type memory device has been widely utilized as a high-speed large-capacity memory. In the static memory device, each of memory cells is formed of a flip-flop storing binary logic information. In such a memory cells, after application of a power supply to the memory or after predetermined information processing, the contents of the memory cells are in a random condition. Therefore, prior to new information processing, all the memory contents are required to be set in the same initial logic state. In other words, the contents of the memory cells must be initialized prior to new information processing. Heretofore, such initiallizing of memory cells has been achieved by successively writing the same data over the all memory addresses through normal write operation. However, according to this method, as a result of enlargement of a memory capacity of the memory, the time required for writing the same data to all the memory cells becomes very long because write operations in numbers corresponding to the number of the memory cells must be repeated. Accordingly, it has been difficult to achieve the initializing of the memory cells at a high speed and with ease.

In this point of view, it may be conceived that flip-flops having unbalanced load elements and/or unbalanced drive transistors are used as memory cells and the contents of such memory cells are set to the same logic state in response to a rise of the power supply voltage. However, according to this method, if the time period from cut off of the power supply to re-application of the power supply to the memory is short, electric charges caused by previous logic states in the memory cells are not completely discharged, and hence in such case all the memory cells cannot be stably set in the same logic state determined by the above mentioned unbalance of the memory cells. Furthermore, after achieving the initiallizing of the memory cells, the contents of the memory cells are easily affected by noise or the like in the normal operation mode because margin for storing data of the memory cells is made small due to the unbalanced structure thereof. Accordingly, the above method is not practical.

It is one object of the present invention to provide a memory device whose memory contents can be easily initialized at a high speed.

It is another object of the present invention to provide a static type memory device which can clear all the memory contents with ease and operate with large operational margin in a normal operation mode.

A static memory device according to the present invention comprises a plurality of word lines, a plurality of digit line pairs intersecting with the word lines, a plurality of static type memory cells arranged at the intersections of the word lines and the digit line pairs, a word decoder having a plurality of output terminals coupled to the word lines, first means for operatively making all the output terminals of the word decoder at a selection level, and second means for operatively setting all the digit line pairs in the same logic state, wherein the contents of the all the memory cells are simultaneously set at the same logic state by enabling the first means and the second means. In the memory device according to the present invention, the first means may be effectively structured by connecting transistors between all the output terminals of address inverter buffers and a reference potential which are made conducting during the initializing operation and made non-conducting during normal memory operation.

According to the above featured first means, all the word lines are simultaneously set at an active level irrespectively of the address input signals with simplified structure.

In the following explanation, N-channel MOS transistors are employed as transistors and positive logic system is employed. However, the present invention is not limited to the above case but applicable to the case P-channel transistors or bipolar transistors are used as the transistors.

Figure 1:
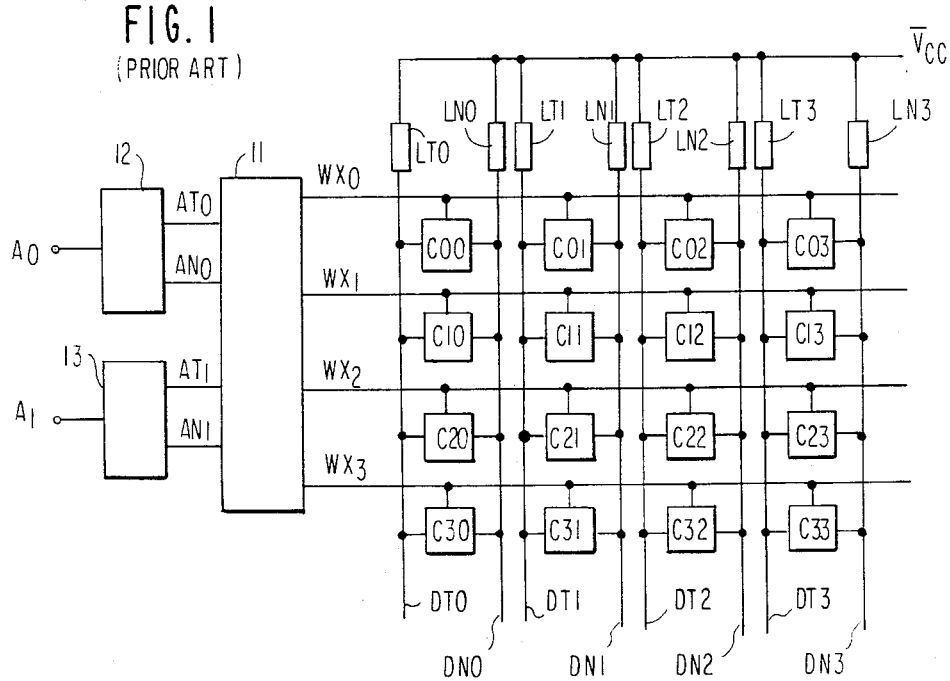
FIG. 1 is a block diagram showing major part of a memory device according to the prior art.
Figure 2:
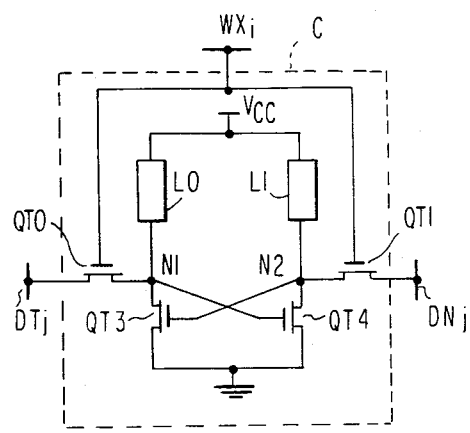
FIG. 2 is a circuit diagram showing a general static type memory cell.
Figure 3:
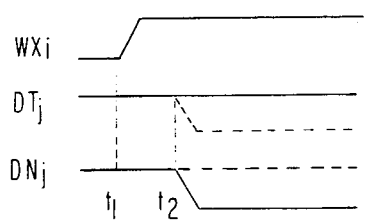
FIG. 3 is a timing chart showing a read operation of the memory device shown in FIG. 1.
Figure 4:
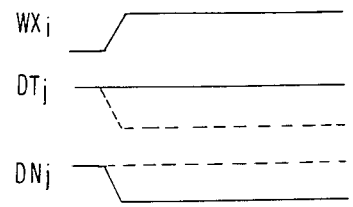
FIG. 4 is a timing chart showing a write operation of the memory device shown in FIG. 1.
Figure 5:
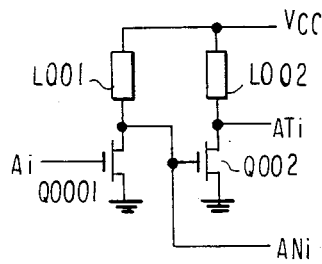
FIG. 5 is a circuit diagram showing an address inverter buffer according to the prior art.
Figure 6:
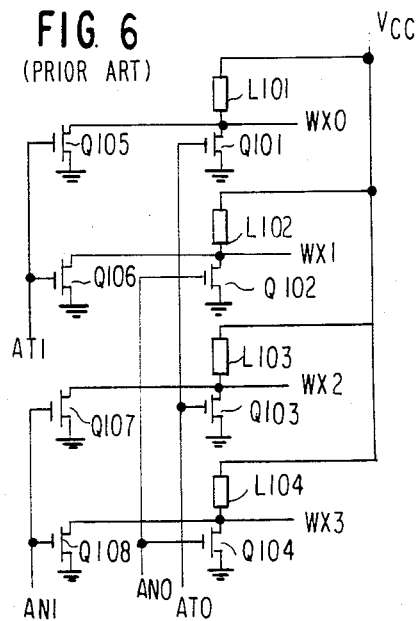
FIG. 6 is a circuit diagram showing a word decoder of the memory device shown in FIG. 1.

With reference to FIGS. 1 to 6, a static memory according to the prior art will be described. In FIG. 1, 16 memory cells C00 to C33 are arranged at intersections of four word lines $WX_0$ to $WX_3$ and four pairs of digit lines (DT0, DN0), (DT1, DN1), (DT2, DN2) and (DT3, DN3). Respective pair of digit lines includes a true digit line DTi (i=0~3) and a complementary digit line DNi which are connected to a power supply Vcc through load elements LTi and LNi respectively. Here, two bits of row address signals $A_0$ and $A_1$ are used to select one of four word lines $WX_0$ to $WX_3$. An address inverter buffer 12 receives the row address signal $A_0$ and generates its true output $AT_0$ and its complementary output $AN_0$. Similarly, an address inverter buffer 13 receives the row address signal $A_1$ and generates its true output $AT_1$ and its complementary output $AN_1$. One example of the address inverter buffers 12 and 13 is shown in FIG. 5. In FIG. 5, a load element L001 and a transistor Q0001 form a first inverter receiving the row address input signal Ai (i=0 or 1) to generate its complementary output $AN_i$. A load element L002 and a transistor Q002 form a second inverter receiving the output ANi of the first inverter at a gate of the transistor Q002 and generates a true output $AT_i$ of the row address input signal $A_i$. The true and complementary outputs $AT_0$ and $AN_0$ of the address inverter buffer 12 and the outputs $AT_1$ and $AN_1$ of the address inverter buffer 13 are applied to a row decoder 11 and used to select one of the word lines $WX_0$ to $WX_3$. One example of the decoder 11 is shown in FIG. 6. The decoder 11 is basically composed of four NOR gates. Namely, a load element L101 and transistors Q101 and Q105 form a NOR gate for selecting the word line $WX_0$. A load element L102 and transistors Q102 and Q106 form a NOR gate for selecting the word line $WX_1$. A load element L103 and transistors Q103 and Q107 form a NOR gate for selecting the word line $WX_2$, and a load element L104 and transistors Q104 and Q108 form a NOR gate for selecting the word line $WX_3$. Typical example of the memory cells in FIG. 1 is shown in FIG. 2. In FIG. 2, a pair of load elements L0 and L1 and a pair of transistors QT3 and QT4 form a flip-flop as data storage means and a pair of transfer gate transistors QT0 and QT1 having gates coupled to a word line WXi, which are coupled between a node $N_1$ and the digit line DTj and between a node $N_2$ and the digit line DNj, respectively. The load elements L0 and L1 may be formed of resistors or field effect transistors. Read operation of the memory cell shown in FIG. 2 will be explained with reference to FIG. 3. First, the word line WXi is turned to a high level at a time point $t_1$ so that true and complementary stored potentials of the flip-flop are transferred to true and complementary digit lines DTj and DNj via conducted transfer gate transistors QT0 and QT1, respectively. Here, it is assumed that a potential at the node $N_1$ is a high level and a potential at the node $N_2$ is a low level. Then, the potential of the digit line DNj starts to change from a high level to a low level at a time point $t_2$ while the potential at the digit line DTj remains at a high level. Thus, a difference in potential corresponding to the logic state of the memory cell is generated between a pair of digit lines DTj and DNj. Such difference in potential is then amplified by a sense amplifier (not shown) and drawn out therefrom as an output signal.

With reference to FIG. 4, a write operation to the memory cell will be explained. At the same time when the word line WXi starts to change from a low level to a high level, the digit line DNj is made to a low level with maintaining the digit line DTj at a high level in accordance with write data supplied through column selection gates (not shown). Then, the potentials of the digit lines DTj and DNj are transmitted to the nodes $N_1$ and $N_2$ via the conducted transfer gate transistors QT0 and QT1, respectively so that the state of the flip-flop of the memory cell is determined in correspondence with the write data.

Next, consideration will be made on the case where write operations of the same data to all the memory cells are conducted. As is well known, each of write operations is conducted on one memory cell designated by a selected word line and selected pair of digit lines. Accordingly, in the memory shown in FIG. 1, 16 times of write operations, i.e. 16 cycles are required to write the same data to all the memory cells. Accordingly, it has been difficult to set all the memory contents in the same logic state at a high speed in the memory according to the prior art.

Figure 7:
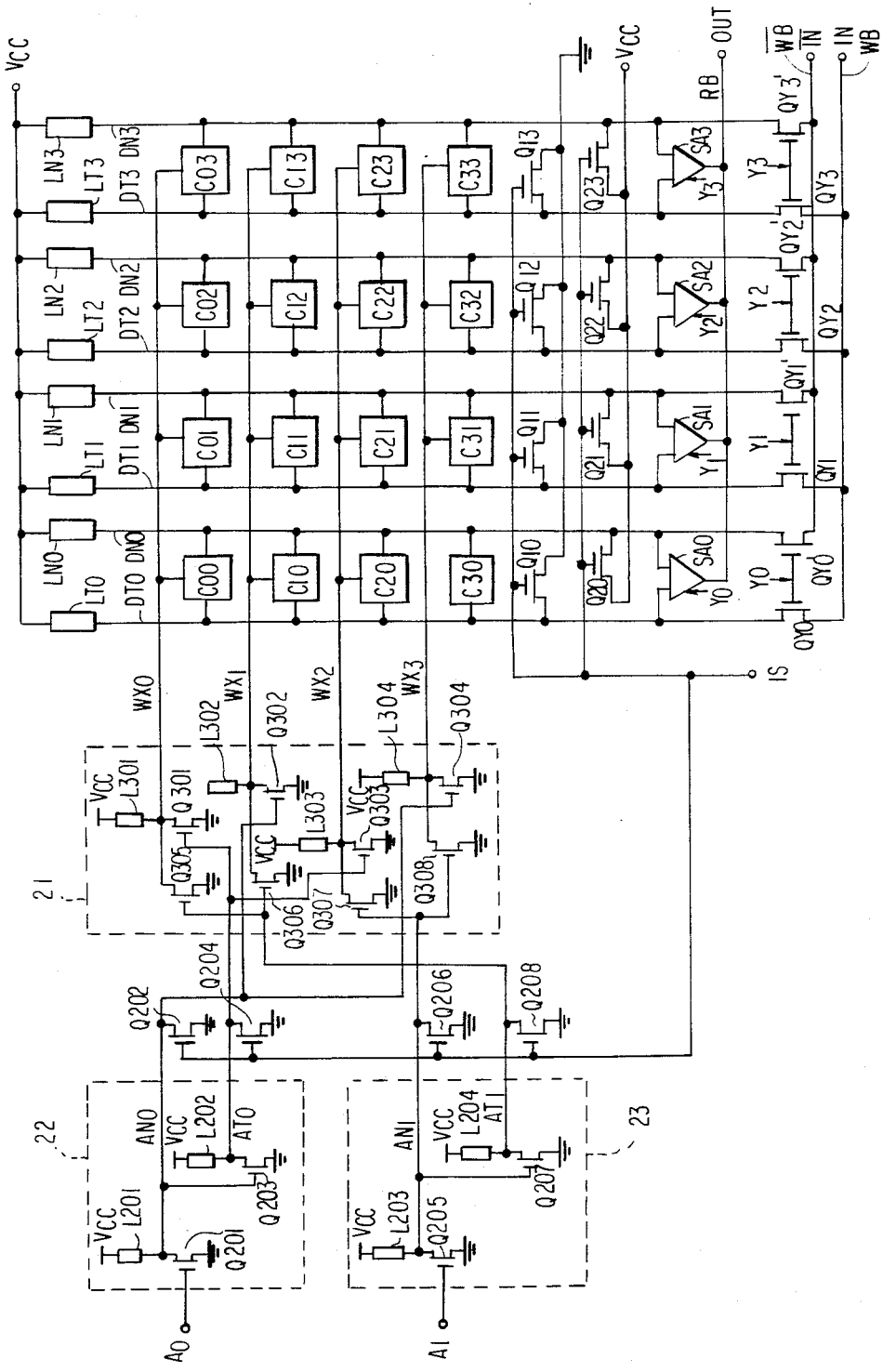
FIG. 7 is a circuit diagram showing the memory device according to one embodiment of the present invention.

With reference to FIG. 7, a static memory according to one embodiment of the present invention will be described. In FIG. 7, the memory cells C00 to C33 are arranged at the intersections of four word lines $WX_0$ to $WX_3$ and four pairs of digit lines (DT0, DN0) to (DT3, DN3) in the similar manner to that of FIG. 1. The memory cells are structured as shown in FIG. 2. The pairs of digit lines (DT0, DN0), (DT1, DN1), (DT2, DN2) and (DT3, DN3) are coupled to a pair of write data bus lines (WB, $\overline{WB}$) via the pairs of column selection gates ($QY_0$, $QY_0'$), ($QY_1$, $QY_1'$), ($QY_2$, $QY_2'$) and ($QY_3$, $QY_3'$), respectively. The four pairs of column selection gates ($QY_0$, $QY_0'$), ($QY_1$, $QY_1'$), ($QY_2$, $QY_2'$) and ($QY_3$, $QY_3'$) are controlled by column selection signals $Y_0$, $Y_1$, $Y_2$ and $Y_3$ respectively so that selected one pair of the four pairs of column selection gates connect the corresponding pair of digit lines to a pair of write data lines. Four gated type sense amplifiers $SA_0$, $SA_1$, $SA_2$ and $SA_3$ are connected to the pairs of digit lines (DT0, DN0) to (DT3, DN3) at their input terminals and their output terminals are connected to a read data line RB in common. Among these sense amplifiers, only one selected by the column selection signal is enabled to generate a read signal while non-selected sense amplifiers are maintained in disenabled state with high-impedanced state of output terminals during a read operation.

A word decoder 21 for selecting one of the word lines has the same structure as that (11) of FIG. 1. Namely, in the decoder 21, transistors Q301 and Q305 and a load element L301 form a NOR gate for selecting the word line $WX_0$, and transistors Q302 and Q306 and a load element L302 form a NOR gate for selecting the word line $WX_1$ in accordance with combinations of two bits of true and complementary address signals ($AT_0$, $AN_0$) and ($AT_1$, $AN_1$). Similarly, transistors Q303 and Q307 and a load element L303 form a NOR gate for selecting the word line $WX_2$, and the transistors Q304 and Q308 and a load element L304 form a NOR gate for selecting the word line $WX_3$. An address inverter buffer 22 includes a first inverter composed of a load element L201 and a transistor Q201 for generating a complementary address signal $AN_0$ of an address input signal $A_0$, and a second inverter composed of a load element L202 and a transistor Q203 receiving the signal $AN_0$ at its gate for generating a true address signal $AT_0$ of the signal $A_0$. An address inverter 23 includes a third inverter composed of a load element L203 and a transistor Q205 for generating a complementary address signal $AN_1$, and a fourth inverter composed of a load element L204 and a transistor Q207 receiving the signal $AN_1$ at its gate for generating a true address signal $AT_1$ of the address signal $A_1$. Here, according to the present invention, for simultaneously making all the word lines at a selection level, i.e. "1" level, transistors Q202, Q204, Q206 and Q208 are inserted between output terminals of the first to fourth inverters which are connected to input terminals of the decoder 21 and the ground potential. The transistors Q202, Q204, Q206 and Q208 are made conducting when an initial set signal IS is activated so that all the output signals $AT_0$, $AN_0$, $AT_1$ and $AN_1$ from the address inverters are forcibly set at an inactive level, i.e. "0" level irrespectively of the states of the address input signals. Accordingly, all the inputs of the word decoder 21 are at a low level and hence all the outputs of the decoder 21 are set at the active level so that all the transfer gate transistors (QT0 and QT1 of FIG. 2) are made conductive and flip-flops of all the memory cells are connected to the corresponding digit line pair. Furthermore, transistors Q10 to Q13 are coupled between the true digit lines DT0 to DT3 and the ground potential, respectively, and transistors Q20 to Q23 are coupled between the complementary digit lines $DN_0$ to $DN_3$ and a power supply Vcc, respectively. Those transistors Q10 to Q13 and Q20 to Q23 are also made conducting by the initial set signal IS so that all the pairs of digit lines are simultaneously set at a predetermined logic state, e.g. "0". Accordingly, by making the initial set signal active, all the word lines are selected and all the pairs of digit lines are set at the same logic state. As a result, contents of all the memory cells are simultaneously set at the same predetermined state.

Figure 8:
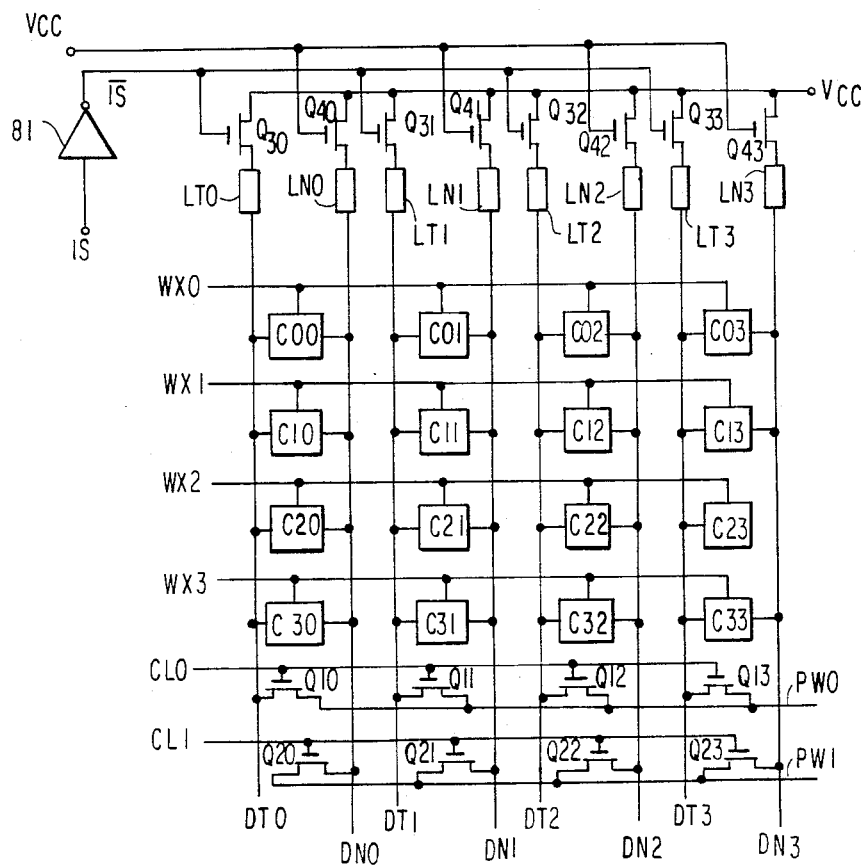
FIG. 8 is a circuit diagram showing another embodiment of the present invention.

With reference to FIG. 8, another embodiment of the present invention will be described. In this embodiment, the same portions as the proceeding embodiment, e.g. the address inverter buffers 22 and 23, and the word decoder 21 are not shown. The characteristic feature of the present invention resides in that transistors Q30 to Q33 are inserted between the true digit lines DT0 to DT3 and a power supply voltage Vcc and transistors Q40 to Q43 are inserted between the complementary digit lines DN0 to DN3 and the power supply voltage Vcc. The transistors Q30 to Q33 are controlled by an inverted initial set signal $\overline{IS}$ obtained from an inverter 81 receiving the initial set signal IS while the transistors Q40 to Q43 are made conducting by receiving the power supply voltage Vcc at their gates. Accordingly, the transistors Q30 to Q33 are made non-conducting in response to a low level of $\overline{IS}$ during the initial set operation so that DC current paths from the power supply Vcc to the ground potential through the true digit lines DT0 to DT3 and the transistors Q10 to Q13 may be avoided. Therefore, the initial set operation can be stably conducted with low power consumption. As described above, according to the present invention, the memory device provided with the initial set function can be obtained.

In the above explanation, by way of example the memory including memory cells arrayed 4×4 is employed. However, it is apparent that the present invention is also applicable to a memory having an optional number of memory cells and to a memory structured by bipolar transistors.

I claim:

1. A memory device comprising a plurality of word lines, a plurality of digit line pairs, each of said digit line pairs including first and second digit lines, a plurality of static type memory cells arranged at the intersections of said word lines and said digit line pairs, means for receiving address signals, a word decoder having a plurality of output terminals each coupled to corresponding one of said word lines, means for receiving a control signal, first means coupled to said word decoder for forcibly set all the output terminals of said word decoder at a selection level irrespectively of said address signals in response to said control signal, and second means for forcibly setting all the first digit lines of said digit line pairs at the same predetermined logic state in response to said control signal.

2. The memory device according to claim 1, in which said word decoder includes a plurality of NOR gates and said first means includes a plurality of transistors coupled between all the input terminals of said word decoder and a reference potential point and having control electrodes to which said control signal is applied.

3. The circuit according to claim 1, in which said second means includes a plurality of first transistors each coupled between the corresponding one of said first digit lines and a reference potential point and a plurality of second transistors each coupled between the corresponding one of said second digit lines and a power supply potential point, and means control electrodes of said first and second transistors with said control signal.

4. The memory device according to claim 1 further comprising a plurality of address inverter buffers coupled to said word decoder, each of said address inverter buffers receiving one of said address signals to generate its true and complementary signals.

5. The memory device according to claim 1, further comprising a plurality of transistors coupled between said first digit lines and a power supply potential point and means for making said transistors non-conducting in response to presence of said control signal and making them conducting in response to absence to said control signal.

6. A memory device comprising a plurality of word lines, a plurality of digit lines, a plurality of memory cells arranged at the intersections of said word lines and said digit lines, a plurality of address terminals for receiving address signals, a plurality of address inverter buffers each coupled to each of said address terminals for generating true and complementary signals at its output terminals with respect to the address signal at said address terminals, a word decoder having a plurality of output terminals each coupled to each of said word lines and a plurality of input terminals coupled to the output terminals of said address inverter buffers, a control terminal for receiving a control signal, a plurality of clamp means coupled with said control terminal, each of said clamp means being coupled between each of said output terminals of said address inverter buffers and a reference potential point and operatively clamping potentials at said output terminals of said address inverter buffers at said reference potential in response to said control signal, and a plurality of set means each coupled to said control terminal and to each of said digit lines for operatively setting said digit lines at a predetermined logic state in response to said control signal.

7. The memory device according to claim 6, in which each of said clamp means includes a transistor coupled between said one of said output terminals of said address inverter buffers and said reference potential point and having a control electrode coupled to said control terminal.

8. The memory device according to claim 6, in which each of said set means includes a transistor coupled between said one of said digit lines and a predetermined potential point and having a control electrode coupled to said control terminal.

9. A memory device comprising a plurality of word lines, a plurality of digit lines, a plurality of memory cells arranged at the intersections of said word lines and said digit lines, means for receiving address input signals, a control terminal for receiving a control signal having first and second logic levels, a word decoder having a plurality of output terminals coupled to said word lines, first means coupled to said word decoder for forcibly setting said output terminals of said word decoder at a selection levels in response to said first logic levels, a plurality of switch means each coupled one of said digit lines and a reference potential point, and means coupled to said control terminal for enabling said plurality of switch means in response to said second logic level of said control signal and disenabling them in response to said first logic level of said control signal.

10. The memory device according to claim 9, in which each of said memory cells is of a static type.

* * * * *